US012620433B2

(12) United States Patent
Park et al.

(10) Patent No.: US 12,620,433 B2
(45) Date of Patent: May 5, 2026

(54) SEMICONDUCTOR DEVICE AND SEMICONDUCTOR SYSTEM RELATED TO COMPENSATING FOR THE GENERATION TIMING OF AN INTERNAL COMMAND

(71) Applicant: SK hynix Inc., Icheon-si (KR)

(72) Inventors: Joon Hong Park, Icheon-si (KR); Jeong Je Park, Icheon-si (KR); Sang Sic Yoon, Icheon-si (KR); Jong Hyuck Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 203 days.

(21) Appl. No.: 18/539,060

(22) Filed: Dec. 13, 2023

(65) Prior Publication Data

US 2025/0037752 A1      Jan. 30, 2025

(30) Foreign Application Priority Data

Jul. 24, 2023      (KR) ........................ 10-2023-0096426

(51) Int. Cl.
*G11C 11/4076*          (2006.01)
(52) U.S. Cl.
CPC ................................ *G11C 11/4076* (2013.01)
(58) Field of Classification Search
CPC . G11C 11/4076; G11C 7/1087; G11C 7/1093; G11C 7/222; G11C 7/1039; G06F 3/0659
See application file for complete search history.

(56) References Cited

U.S. PATENT DOCUMENTS

| | | | |
|---|---|---|---|
| 9,858,972 B1 * | 1/2018 | Kim | ........................ G11C 7/109 |
| 10,121,524 B1 * | 11/2018 | Kim | ..................... G11C 7/1084 |
| 2020/0373929 A1 * | 11/2020 | Jang | ........................... H03L 7/18 |

FOREIGN PATENT DOCUMENTS

| | | |
|---|---|---|
| KR | 20190009534 A | 1/2019 |
| KR | 20200088701 A | 7/2020 |

* cited by examiner

*Primary Examiner* — Amir Zarabian
*Assistant Examiner* — Bradley S Coon
(74) *Attorney, Agent, or Firm* — WILLIAM PARK AND ASSOCIATES LTD.

(57)          ABSTRACT

A semiconductor device includes a frequency division circuit configured to generate a first division clock and a second division clock by dividing a frequency of a clock, and an internal command generation circuit configured to generate an internal command based on a command in synchronization with the first division clock and the second division clock, configured to latch, in a pipe latch, a phase detection signal that is generated based on the timing at which the command is received, and configured to compensate for generation timing of the internal command based on the phase detection signal that has been latched in the pipe latch.

23 Claims, 16 Drawing Sheets

SEMICONDUCTOR DEVICE AND SEMICONDUCTOR SYSTEM RELATED TO COMPENSATING FOR THE GENERATION TIMING OF AN INTERNAL COMMAND

CROSS-REFERENCE TO RELATED APPLICATION

The present application claims priority under 35 U.S.C. § 119 (a) to Korean Patent Application No. 10-2023-0096426, filed in the Korean Intellectual Property Office on Jul. 24, 2023, the entire disclosure of which is incorporated herein by reference.

BACKGROUND

1. Technical Field

The present disclosure generally relates to a semiconductor device and semiconductor system, and more particularly a semiconductor device and semiconductor system configured to latch, in a pipe latch, a phase detection signal that is generated by detecting the input timing of a command that is input in synchronization with a clock and configured to compensate for the generation timing of an internal command that is generated from the command based on the phase detection signal that has been latched in the pipe latch.

1. Related Art

In general, a semiconductor device including double data rate synchronous DRAM (DDR SDRAM) performs internal operations in response to a command that is input by an external chip set. In order for the semiconductor device to perform such read and write operations, the semiconductor device needs to include various circuits. The various circuits include a pipe circuit for efficiently controlling more signals. In general, the pipe circuit is a circuit configured to store each of a plurality of input signals at desired timing and to output each signal at desired timing. The pipe circuit is included in the semiconductor device, and can increase the transmission and reception of signals between internal circuits or between an external device of the semiconductor device and an internal circuit of the semiconductor device.

Furthermore, the semiconductor device includes a shifting circuit configured to shift a command by using multiple division clocks that are generated by dividing the frequency of a clock. Such a semiconductor device includes multiple shifting circuits by multiple division clocks, and may generate an internal command for performing an internal operation by shifting a command.

SUMMARY

In an embodiment, a semiconductor device may include a frequency division circuit configured to receive a clock to generate a first division clock and a second division clock by dividing a frequency of the clock, and an internal command generation circuit configured to receive a command in synchronization with the first division clock and the second division clock to generate an internal command based on the command received in synchronization with the first division clock and the second division clock, configured to latch, in a pipe latch, a phase detection signal that is generated based on the timing at which the command is received, and configured to compensate for generation timing of the internal command based on the phase detection signal that has been latched in the pipe latch.

Furthermore, in an embodiment, a semiconductor system may include a controller configured to output a clock that is periodically toggled and configured to output a command, an address, and data, and a semiconductor device configured to sequentially latch, in multiple pipe latches, a phase detection signal that is generated by detecting input timing of the command that is input in synchronization with the clock, configured to compensate for generation timing of an internal command that is generated from the command based on the phase detection signal that has been latched in the multiple pipe latches, and configured to store the data based on the internal command and the address.

BRIEF DESCRIPTION OF THE DRAWINGS

FIG. 4 is a timing diagram for describing an example of an operation of the frequency division circuit illustrated in FIG. 3.

FIG. 7 is a diagram illustrating a construction according to an embodiment of a synthesis command generation circuit that is included in the internal command generation circuit illustrated in FIG. 5.

FIG. 8 is a block diagram illustrating a construction according to an embodiment of a shifting circuit that is included in the internal command generation circuit illustrated in FIG. 5.

FIG. 12 is a block diagram illustrating a construction according to an embodiment of a pipe circuit that is included in the selection signal generation circuit illustrated in FIG. 9.

FIG. 13 is a block diagram illustrating a construction according to an embodiment of a command phase control circuit that is included in the internal command generation circuit illustrated in FIG. 5.

DETAILED DESCRIPTION

Figure 1:
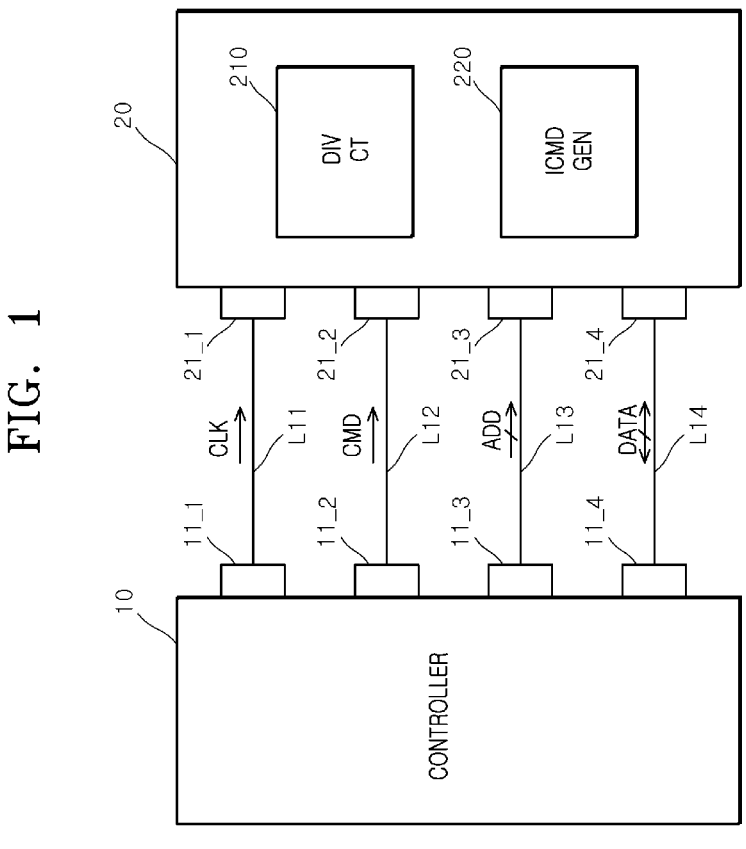
FIG. 1 is a block diagram illustrating a construction of a semiconductor system according to an embodiment of the present disclosure.

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. In contrast, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

Hereafter, the present disclosure will be described in more detail through embodiments. The embodiments are only used to exemplify the present disclosure, and the scope of the present disclosure is not limited by the embodiments.

Embodiments of the present disclosure provide a semiconductor device and semiconductor system for latching, in a pipe latch, a phase detection signal that is generated by detecting input timing of a command that is input in synchronization with a clock and compensating for generation timing of an internal command that is generated from the command based on the phase detection signal that has been latched in the pipe latch.

According to an embodiment of the present disclosure, there is an effect in that a phase detection signal that is generated by detecting input timing of a command that is input in synchronization with a clock can be latched in a pipe latch and generation timing of an internal command that is generated from the command based on the phase detection signal that has been latched in the pipe latch can be compensated for.

Furthermore, according to an embodiment of the present disclosure, there is an effect in that the area and current consumption of a shifting circuit for shifting an internal command can be reduced by latching, in a pipe latch, a phase detection signal that is generated by detecting input timing of a command and compensating for generation timing of an internal command by using one shifting circuit based on the phase detection signal.

As illustrated in FIG. 1, a semiconductor system 1 according to an embodiment of the present disclosure may include a controller 10 and a semiconductor device 20. The semiconductor device 20 may include a frequency division circuit (DIV CT) 210 and an internal command generation circuit (ICMD GEN) 220.

The controller 10 may include a first control pin 11_1, a second control pin 11_2, a third control pin 11_3, and a fourth control pin 11_4. The semiconductor device 20 may include a first device pin 21_1, a second device pin 21_2, a third device pin 21_3, and a fourth device pin 21_4. A first transmission line L11 may be connected between the first control pin 11_1 and the first device pin 21_1. A second transmission line L12 may be connected between the second control pin 11_2 and the second device pin 21_2. A third transmission line L13 may be connected between the third control pin 11_3 and the third device pin 21_3. A fourth transmission line L14 may be connected between the fourth control pin 11_4 and the fourth device pin 21_4.

The controller 10 may transmit a clock CLK to the semiconductor device 20 through the first transmission line L11. The controller 10 may transmit a command CMD for controlling the semiconductor device 20 to the semiconductor device 20 through the second transmission line L12. The controller 10 may transmit an address ADD to the semiconductor device 20 through the third transmission line L13. The controller 10 may transmit data DATA to the semiconductor device 20 through the fourth transmission line L14. The controller 10 may receive data DATA from the semiconductor device 20 through the fourth transmission line L14. The clock CLK may be set as a signal that is periodically toggled in order to synchronize operations of the controller 10 and the semiconductor device 20. The command CMD may be set as a signal for controlling an internal operation of the semiconductor device 20. The address ADD may include multiple bits, and may be set as a signal for setting a location at which the data DATA are stored. The data DATA may include multiple bits. The multiple bits may be input and output in series.

The frequency division circuit 210 may generate a first division clock (ICLK in FIG. 2) and a second division clock (OCLK in FIG. 2) by dividing the frequency of the clock CLK. The frequency division circuit 210 may generate the first division clock (ICLK in FIG. 2) including a pulse that has a ½ frequency of the clock CLK and that is generated in synchronization with an odd-numbered pulse of the clock CLK, by dividing the frequency of the clock CLK. The frequency division circuit 210 may generate the second division clock (OCLK in FIG. 2) including a pulse that has a ½ frequency of the clock CLK and that is generated in synchronization with an even-numbered pulse of the clock CLK, by dividing the frequency of the clock CLK. The frequency division circuit 210 may generate the first division clock (ICLK in FIG. 2) and the second division clock (OCLK in FIG. 2) having opposite phases by dividing the frequency of the clock CLK.

Figure 2:
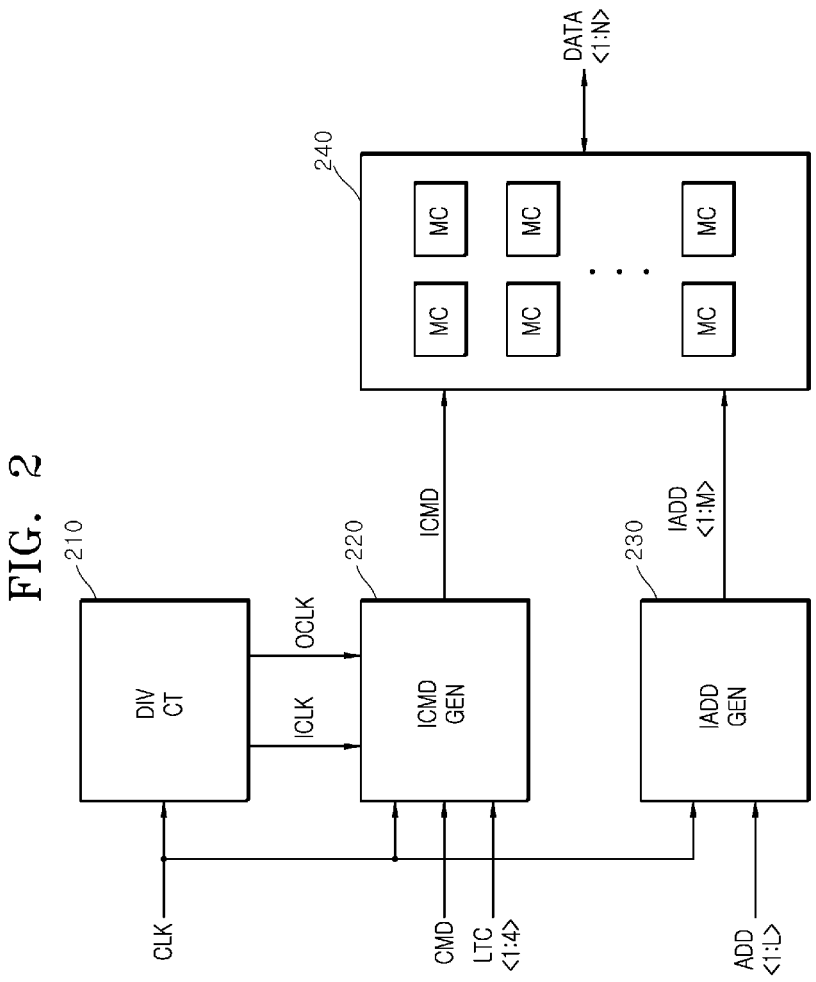
FIG. 2 is a block diagram illustrating a construction according to an embodiment of a semiconductor device that is included in the semiconductor system illustrated in FIG. 1.

The internal command generation circuit 220 may generate an internal command (ICMD in FIG. 2) based on the command CMD in synchronization with the first division clock (ICLK in FIG. 2) and the second division clock (OCLK in FIG. 2). The internal command generation circuit 220 may sequentially latch, in multiple pipe latches (343_1 to 343_4 in FIG. 12), a phase detection signal (PD in FIG. 5) that is generated based on timing at which the command CMD is input. The internal command generation circuit 220 may compensate for generation timing of the internal command (ICMD in FIG. 2) based on the phase detection signal (PD in FIG. 5) that has been latched in the multiple pipe latches.

The semiconductor device 20 may sequentially latch, in the multiple pipe latches (343_1 to 343_4 in FIG. 12), the phase detection signal (PD in FIG. 5) that is generated by detecting input timing of the command CMD that is input in synchronization with the clock CLK. The semiconductor device 20 may compensate for generation timing of the internal command (ICMD in FIG. 2) based on the phase detection signal (PD in FIG. 5) that has been latched in the multiple pipe latches. The semiconductor device 20 may store the data DATA in a memory circuit (240 in FIG. 2) based on the internal command (ICMD in FIG. 2) and the address ADD. The semiconductor device 20 may output the data DATA that have been stored in the memory circuit (240 in FIG. 2), based on the internal command (ICMD in FIG. 2) and the address ADD.

As illustrated in FIG. 2, the semiconductor device 20 according to an embodiment of the present disclosure may include a frequency division circuit (DIV CT) 210, an internal command generation circuit (ICMD GEN) 220, an internal address generation circuit (IADD GEN) 230, and the memory circuit 240.

The frequency division circuit 210 may generate the first division clock ICLK and the second division clock OCLK by dividing the frequency of the clock CLK. The frequency division circuit 210 may generate the first division clock ICLK including a pulse that has a ½ frequency of the clock CLK and that is generated in synchronization with an odd-numbered pulse of the clock CLK, by dividing the frequency of the clock CLK. The frequency division circuit 210 may generate the second division clock OCLK including a pulse that has a ½ frequency of the clock CLK and that is generated in synchronization with an even-numbered pulse of the clock CLK, by dividing the frequency of the clock CLK. The frequency division circuit 210 may generate the first division clock ICLK and the second division clock OCLK having opposite phases by dividing the frequency of the clock CLK.

The internal command generation circuit 220 may generate the internal command ICMD based on the command CMD in synchronization with the first division clock ICLK and the second division clock OCLK. The internal command generation circuit 220 may generate the internal command ICMD by shifting the command CMD based on first to fourth latency signals LTC<1:4> in synchronization with the first division clock ICLK and the second division clock OCLK. The internal command generation circuit 220 may sequentially latch, in the multiple pipe latches (343_1 to 343_4 in FIG. 12), the phase detection signal (PD in FIG. 5) that is generated based on timing at which the command CMD is input. The internal command generation circuit 220 may compensate for generation timing of the internal command ICMD based on the phase detection signal (PD in FIG. 5) that has been latched in the multiple pipe latches. The first to fourth latency signals LTC<1:4> may be set as signals for setting write latency, that is, the time taken for all of first to N-th data DATA<1:N> to be input from input timing of the command CMD after the start of a write operation. The first to fourth latency signals LTC<1:4> may be set as signals that are generated from a mode register set MRS that is included in the semiconductor device 20. The internal command ICMD may be set as a signal for performing a write operation for storing the first to N-th data DATA<1:N> in the memory circuit 240. The internal command ICMD has been set as a signal for performing a write operation, but may be set as a signal for performing a read operation of outputting the first to N-th data DATA<1:N> that have been stored in the memory circuit 240 according to an embodiment. According to an embodiment, the internal command ICMD may be set as a signal for performing various operations, such as a precharge operation and refresh operation of the semiconductor device 20.

The internal address generation circuit 230 may generate first to M-th internal addresses IADD<1: M> based on first to L-th addresses ADD<1: L> in synchronization with the clock CLK. The internal address generation circuit 230 may generate the first to M-th internal addresses IADD<1: M> by decoding the first to L-th addresses ADD<1: L> in synchronization with the clock CLK. The number of bits of the first to L-th addresses ADD<1: L> may be set as various numbers of bits according to an embodiment. The number "L" of bits of the first to L-th addresses ADD<1: L> may be set as a positive integer. The number of bits of the first to M-th internal addresses IADD<1: M> may be set as various numbers of bits according to an embodiment. The number "M" of bits of the first to M-th internal addresses IADD<1: M> may be set as a positive integer.

The memory circuit 240 may include multiple memory cells MC. The memory circuit 240 may store the first to N-th data DATA<1:N> in a memory cell MC that is selected by the first to M-th internal addresses IADD<1: M> when the internal command ICMD is generated after the start of a write operation. The memory circuit 240 according to an embodiment may output the first to N-th data DATA<1:N> that have been stored in a memory cell MC that is selected by the first to M-th internal addresses IADD<1: M> when the internal command ICMD is generated after the start of a read operation. The memory circuit 240 may be implemented by a common memory cell array including various internal circuits for inputting and outputting the first to N-th data DATA<1:N> after the start of a write operation and a read operation. The number "N" of bits of the first to N-th data DATA<1:N> may be set as a positive integer.

The semiconductor device 20 may sequentially latch, in the multiple pipe latches (343_1 to 343_4 in FIG. 12), the phase detection signal (PD in FIG. 5) that is generated by detecting input timing of the command CMD that is input in synchronization with the clock CLK. The semiconductor device 20 may compensate for generation timing of the internal command ICMD based on the phase detection signal (PD in FIG. 5) that has been latched in the multiple pipe latches. The semiconductor device 20 may store the first to N-th data DATA<1:N> in the memory circuit 240 based on the internal command ICMD and the first to L-th addresses ADD<1: L> after the start of a write operation. The semiconductor device 20 may output the stored first to N-th data DATA<1:N> based on the internal command ICMD and the first to L-th addresses ADD<1: L> after the start of a read operation.

Figure 3:
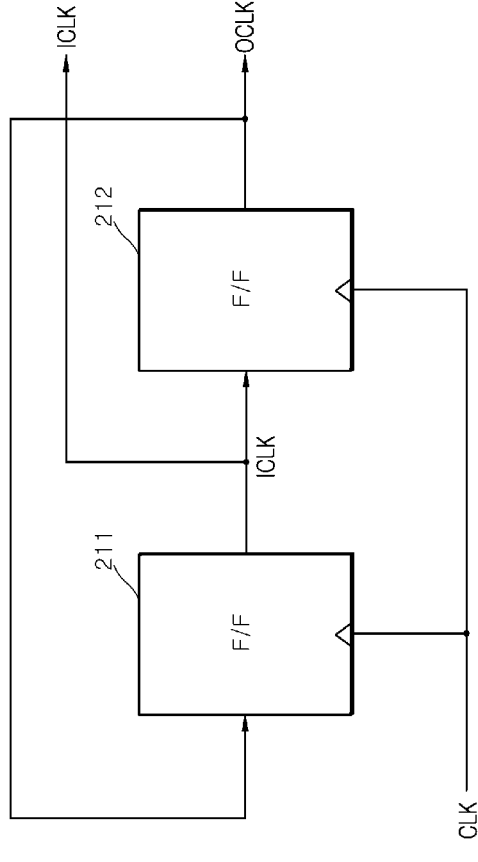
FIG. 3 is a block diagram illustrating a construction according to an embodiment of a frequency division circuit that is included in the semiconductor device illustrated in FIG. 2.

FIG. 3 is a block diagram illustrating a construction according to an embodiment of the frequency division circuit 210 that is included in the semiconductor device 20. The frequency division circuit 210 may include a first division clock generation circuit (F/F) 211 and a second division clock generation circuit (F/F) 212.

The first division clock generation circuit 211 may be implemented by a flip-flop (F/F). The first division clock generation circuit 211 may generate the first division clock ICLK having a ½ frequency of the clock CLK by dividing the frequency of the clock CLK. The first division clock generation circuit 211 may latch the second division clock OCLK for a logic low level interval of the clock CLK. The first division clock generation circuit 211 may output, as the first division clock ICLK, the second division clock OCLK that has been latched for one cycle interval of the clock CLK. The first division clock generation circuit 211 may generate the first division clock ICLK including a pulse that is generated by latching the second division clock OCLK in synchronization with an odd-numbered pulse of the clock CLK. The first division clock generation circuit 211 may generate the first division clock ICLK including a pulse having the pulse width of one cycle of the clock CLK.

The second division clock generation circuit 212 may be implemented by a flip-flop (F/F). The second division clock generation circuit 212 may generate the second division clock OCLK having a ½ frequency of the clock CLK by dividing the frequency of the clock CLK. The second division clock generation circuit 212 may latch the first division clock ICLK for a logic low level interval of the clock CLK. The second division clock generation circuit 212 may output, as the second division clock OCLK, the first division clock ICLK that has been latched for one cycle interval of the clock CLK. The second division clock generation circuit 212 may generate the second division clock OCLK including a pulse that is generated by latching the first division clock ICLK in synchronization with an even-numbered pulse of the clock CLK. The second division clock generation circuit 212 may generate the second division clock OCLK including a pulse having the pulse width of one cycle of the clock CLK.

Figure 4:
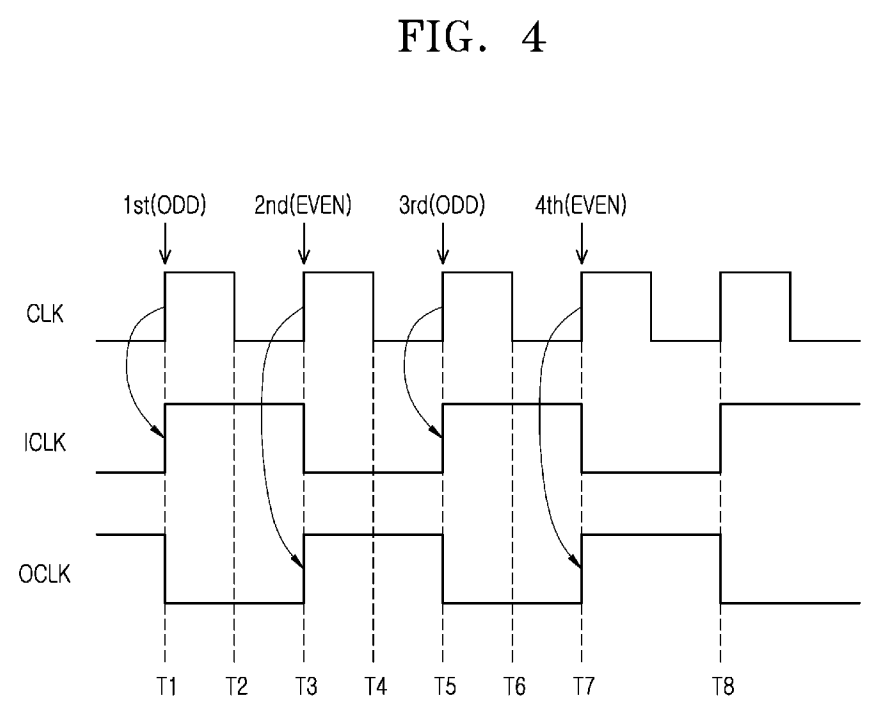

An operation of the frequency division circuit 210 according to an embodiment of the present disclosure is described as follows with reference to FIG. 4.

The first division clock generation circuit 211 may latch the second division clock OCLK for a logic low level interval of the clock CLK.

At timing T1, the first division clock generation circuit 211 may generate a first pulse of the first division clock ICLK by dividing the frequency of the clock CLK in synchronization with a first pulse ($1^{st}$ ODD) of the clock CLK. The first division clock generation circuit 211 may output, as the first pulse of the first division clock ICLK, the second division clock OCLK that has been latched during the pulse width of one cycle of the clock CLK. The first pulse ($1^{st}$ ODD) of the clock CLK may be set as an odd-numbered pulse of the clock CLK. The first pulse of the first division clock ICLK may be generated from timing T1 to timing T3.

At timing T2, the second division clock generation circuit 212 may latch the first division clock ICLK for a logic low level interval of the clock CLK.

At timing T3, the second division clock generation circuit 212 may generate a first pulse of the second division clock OCLK by dividing the frequency of the clock CLK in synchronization with a second pulse ($2^{nd}$ EVEN) of the clock CLK. The second division clock generation circuit 212 may output, as the first pulse of the second division clock OCLK, the first division clock ICLK that has been latched during the pulse width of one cycle of the clock CLK. The second pulse ($2^{nd}$ EVEN) of the clock CLK may be set as an even-numbered pulse of the clock CLK. The first pulse of the second division clock OCLK may be generated from timing T3 to timing T5.

At timing T4, the first division clock generation circuit 211 may latch the second division clock OCLK for a logic low level interval of the clock CLK.

At timing T5, the first division clock generation circuit 211 may generate a second pulse of the first division clock ICLK by dividing the frequency of the clock CLK in synchronization with a third pulse ($3^{rd}$ ODD) of the clock CLK. The first division clock generation circuit 211 may output, as the second pulse of the first division clock ICLK, the second division clock OCLK that has been latched during the pulse width of one cycle of the clock CLK. The third pulse ($3^{rd}$ ODD) of the clock CLK may be set as an odd-numbered pulse of the clock CLK. The second pulse of the first division clock ICLK may be generated from timing T5 to timing T7.

At timing T6, the second division clock generation circuit 212 may latch the first division clock ICLK for a logic low level interval of the clock CLK.

At timing T7, the second division clock generation circuit 212 may generate a second pulse of second division clock OCLK by dividing the frequency of the clock CLK in synchronization with a fourth pulse ($4^{th}$ EVEN) of the clock CLK. The second division clock generation circuit 212 may output, as the second pulse of the second division clock OCLK, the first division clock ICLK that has been latched during the pulse width of one cycle of the clock CLK. The fourth pulse ($4^{th}$ EVEN) of the clock CLK may be set as an even-numbered pulse of the clock CLK. The second pulse of second division clock OCLK may be generated from timing T7 to timing T8.

Figure 5:
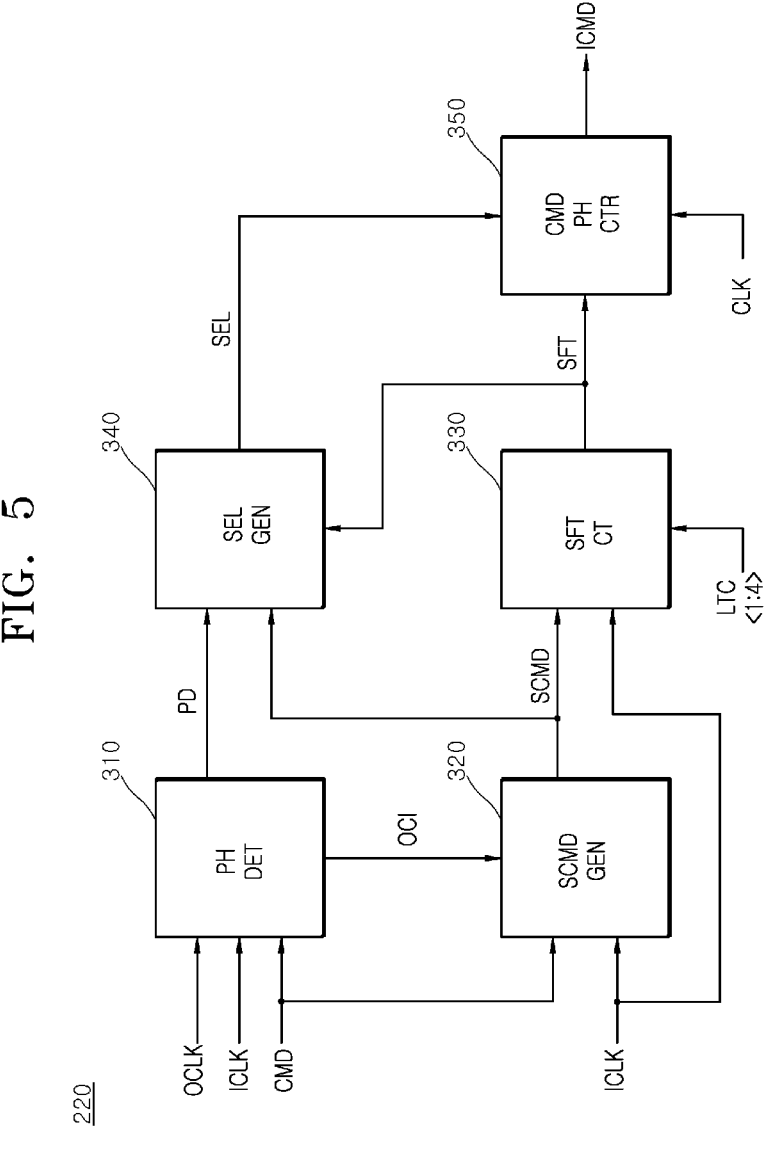
FIG. 5 is a block diagram illustrating a construction according to an embodiment of an internal command generation circuit that is included in the semiconductor device illustrated in FIG. 2.

FIG. 5 is a block diagram illustrating a construction according to an embodiment of the internal command generation circuit 220 that is included in the semiconductor device 20. The internal command generation circuit 220 may include a phase detection circuit (PH DET) 310, a synthesis command generation circuit (SCMD GEN) 320, a shifting circuit (SFT CT) 330, a selection signal generation circuit (SEL GEN) 340, and a command phase control circuit (CMD PH CTR) 350.

The phase detection circuit 310 may generate the phase detection signal PD and a first input command signal OCI by detecting input timing of the command CMD in synchronization with the first division clock ICLK and the second division clock OCLK. The phase detection circuit 310 may generate the phase detection signal PD and the first input command signal OCI by latching the command CMD in synchronization with the first division clock ICLK and the second division clock OCLK. The phase detection circuit 310 may generate the phase detection signal PD by latching the command CMD in synchronization with a rising edge of the second division clock OCLK. The phase detection circuit 310 may generate the phase detection signal PD that is enabled to a logic high level when the command CMD is input, in synchronization with a rising edge of the second division clock OCLK. The phase detection circuit 310 may generate the phase detection signal PD that is disabled to a logic low level when the command CMD is not input, in synchronization with a rising edge of the second division clock OCLK. The phase detection circuit 310 may generate the first input command signal OCI by latching the phase detection signal PD in synchronization with a rising edge of the first division clock ICLK. The phase detection circuit 310 may generate the first input command signal OCI that is enabled to a logic high level when the phase detection signal PD is enabled in synchronization with a rising edge of the first division clock ICLK. The phase detection circuit 310 may generate the first input command signal OCI that is disabled to a logic low level when the phase detection signal PD is disabled in synchronization with a rising edge of the first division clock ICLK.

The synthesis command generation circuit 320 may generate a synthesis command SCMD by synthesizing the command CMD and the first input command signal OCI in synchronization with the first division clock ICLK. The synthesis command generation circuit 320 may generate the synthesis command SCMD that is enabled to a logic high level when any one of the command CMD and the first input command signal OCI is enabled to a logic high level in synchronization with a rising edge of the first division clock ICLK.

The shifting circuit 330 may generate a shifting signal SFT by shifting the synthesis command SCMD by a set interval in synchronization with the first division clock ICLK. The shifting circuit 330 may generate the shifting signal SFT by shifting the synthesis command SCMD by the set interval based on the first to fourth latency signals LTC<1:4> in synchronization with the first division clock ICLK. The set interval may be set as a write latency interval.

The selection signal generation circuit 340 may sequentially latch the phase detection signal PD in the multiple pipe latches (343_1 to 343_4 in FIG. 12) in synchronization with the synthesis command SCMD. The selection signal generation circuit 340 may generate a selection signal SEL based on the phase detection signal PD that has been latched in the multiple pipe latches, in synchronization with the shifting signal SFT.

The command phase control circuit 350 may generate the internal command ICMD by shifting the shifting signal SFT in response to the selection signal SEL in synchronization with the clock CLK. The command phase control circuit 350 may generate the internal command ICMD based on the shifting signal SFT in synchronization with a rising edge of the clock CLK when the selection signal SEL is disabled to a logic low level. The command phase control circuit 350 may generate the internal command ICMD by shifting the shifting signal SFT for one cycle of the clock CLK when the selection signal SEL is enabled to a logic high level.

Figure 6:
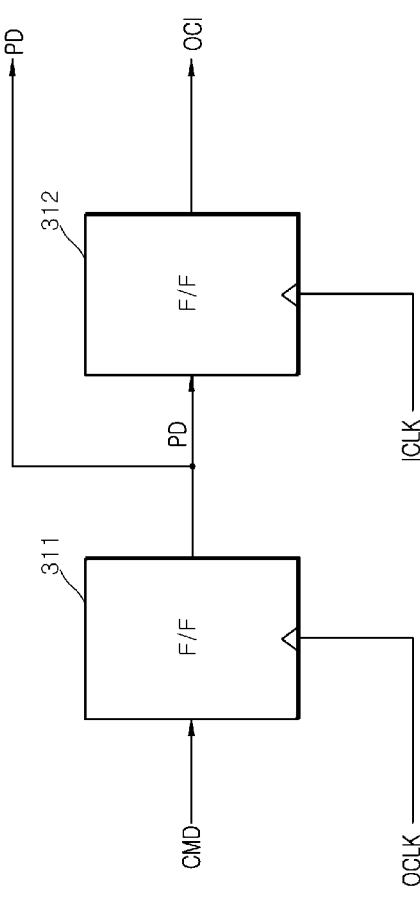
FIG. 6 is a block diagram illustrating a construction according to an embodiment of a phase detection circuit that is included in the internal command generation circuit illustrated in FIG. 5.

FIG. 6 is a block diagram illustrating a construction according to an embodiment of the phase detection circuit 310 that is included in the internal command generation circuit 220. The phase detection circuit 310 may include a first command input circuit (F/F) 311 and a second command input circuit (F/F) 312.

The first command input circuit 311 may be implemented by a flip-flop (F/F). The first command input circuit 311 may generate the phase detection signal PD by latching the command CMD in synchronization with a rising edge of the second division clock OCLK. The first command input circuit 311 may generate the phase detection signal PD that is enabled to a logic high level when the command CMD having a logic high level is input, in synchronization with a rising edge of the second division clock OCLK. The first command input circuit 311 may generate the phase detection signal PD that is disabled to a logic low level when the command CMD having a logic low level is input, in synchronization with a rising edge of the second division clock OCLK.

The second command input circuit 312 may be implemented by a flip-flop (F/F). The second command input circuit 312 may generate the first input command signal OCI that is enabled to a logic high level when the phase detection signal PD is enabled to a logic high level in synchronization with a rising edge of the first division clock ICLK. The second command input circuit 312 may generate the first input command signal OCI that is disabled to a logic low level when the phase detection signal PD is disabled to a logic low level in synchronization with a rising edge of the first division clock ICLK.

Figure 7:
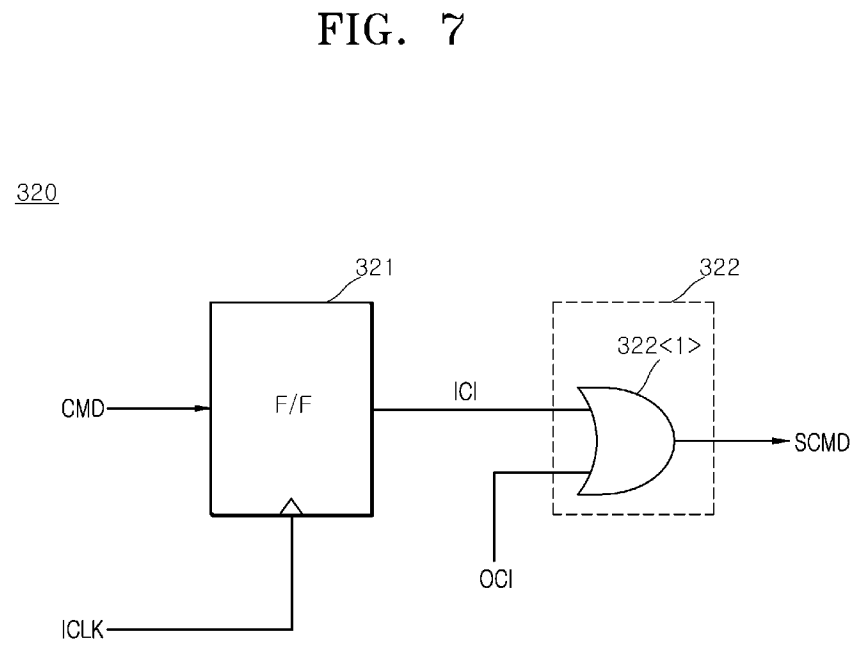

FIG. 7 is a diagram illustrating a construction according to an embodiment of the synthesis command generation circuit 320 that is included in the internal command generation circuit 220. The synthesis command generation circuit 320 may include a third command input circuit (F/F) 321 and a signal synthesis circuit 322.

The third command input circuit 321 may be implemented by a flip-flop (F/F). The third command input circuit 321 may generate a second input command signal ICI that is enabled to a logic high level when the command CMD having a logic high level is input in synchronization with a rising edge of the first division clock ICLK. The third command input circuit 321 may generate the second input command signal ICI that is disabled to a logic low level when the command CMD having a logic low level is input in synchronization with a rising edge of the first division clock ICLK.

The signal synthesis circuit 322 may be implemented by an OR gate 322<1>. The signal synthesis circuit 322 may generate the synthesis command SCMD by synthesizing the first input command signal OCI and the second input command signal ICI. The signal synthesis circuit 322 may generate the synthesis command SCMD that is enabled to a logic high level when any one of the first input command signal OCI and the second input command signal ICI is enabled to a logic high level.

Figure 8:
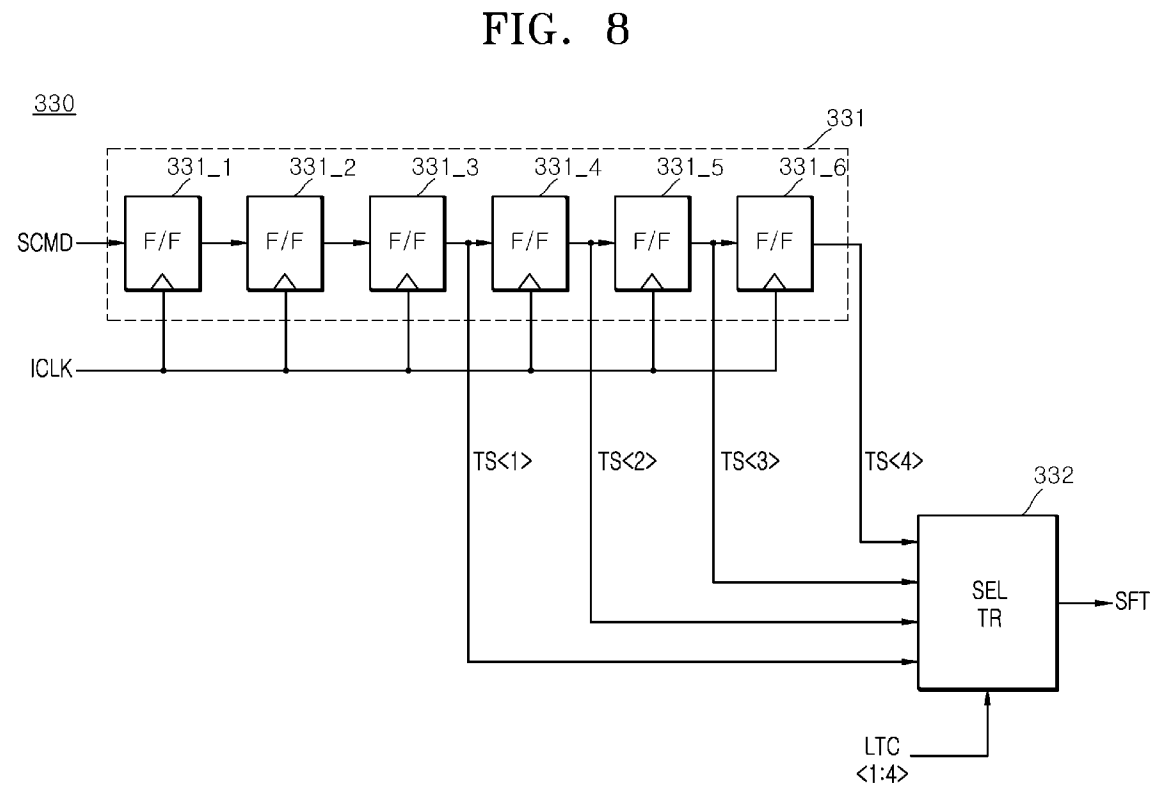

FIG. 8 is a block diagram illustrating a construction according to an embodiment of the shifting circuit 330 that is included in the internal command generation circuit 220. The shifting circuit 330 may include a transfer signal generation circuit 331 and a selection transfer circuit (SEL TR) 332.

The transfer signal generation circuit 331 may include first to sixth flip-flops 331_1, 331_2, 331_3, 331_4, 331_5, and 331_6. The first flip-flop 331_1 may output the synthesis command SCMD by shifting the synthesis command SCMD for one cycle interval of the first division clock ICLK in synchronization with a rising edge of the first division clock ICLK. The second flip-flop 331_2 may output the output signal of the first flip-flop 331_1 by shifting the output signal of the first flip-flop 331_1 for one cycle interval of the first division clock ICLK in synchronization with a rising edge of the first division clock ICLK. The third flip-flop 331_3 may generate a first transfer signal TS<1> by shifting the output signal of the second flip-flop 331_2 for one cycle interval of the first division clock ICLK in synchronization with a rising edge of the first division clock ICLK.

The fourth flip-flop 331_4 may generate a second transfer signal TS<2> by shifting the first transfer signal TS<1> for one cycle interval of the first division clock ICLK in synchronization with a rising edge of the first division clock ICLK. The fifth flip-flop 331_5 may generate a third transfer signal TS<3> by shifting the second transfer signal TS<2> for one cycle interval of the first division clock ICLK in synchronization with a rising edge of the first division clock ICLK. The sixth flip-flop 331_6 may generate a fourth transfer signal TS<4> by shifting the third transfer signal TS<3> for one cycle interval of the first division clock ICLK in synchronization with a rising edge of the first division clock ICLK. The transfer signal generation circuit 331 has been implemented to include only the first to sixth flip-flops

331_1, 331_2, 331_3, 331_4, 331_5, and 331_6, but may be implemented to include various numbers of flip-flops according to an embodiment.

The selection transfer circuit 332 may output, as the shifting signal SFT, any one of the first transfer signal TS<1>, the second transfer signal TS<2>, the third transfer signal TS<3>, and the fourth transfer signal TS<4> based on the first to fourth latency signals LTC<1:4>. The selection transfer circuit 332 may output the first transfer signal TS<1> as the shifting signal SFT when the first latency signal LTC<1> is enabled to a logic high level. The selection transfer circuit 332 may output the second transfer signal TS<2> as the shifting signal SFT when the second latency signal LTC<2> is enabled to a logic high level. The selection transfer circuit 332 may output the third transfer signal TS<3> as the shifting signal SFT when the third latency signal LTC<3> is enabled to a logic high level. The selection transfer circuit 332 may output the fourth transfer signal TS<4> as the shifting signal SFT when the fourth latency signal LTC<4> is enabled to a logic high level.

Figure 9:
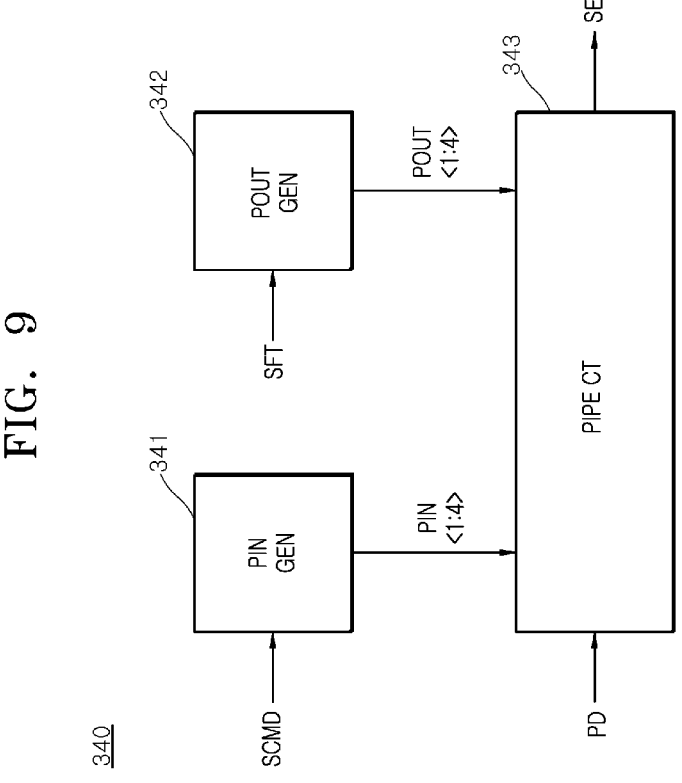
FIG. 9 is a block diagram illustrating a construction according to an embodiment of a selection signal generation circuit that is included in the internal command generation circuit illustrated in FIG. 5.

FIG. 9 is a block diagram illustrating a construction according to an embodiment of the selection signal generation circuit 340 that is included in the internal command generation circuit 220. The selection signal generation circuit 340 may include an input control signal generation circuit (PIN GEN) 341, an output control signal generation circuit (POUT GEN) 342, and a pipe circuit (PIPE CT) 343.

The input control signal generation circuit 341 may generate first to fourth input control signals PIN<1:4> that are sequentially enabled whenever the synthesis command SCMD is input. The input control signal generation circuit 341 may generate the first input control signal PIN<1> that is enabled when the synthesis command SCMD is input for the first time. The input control signal generation circuit 341 may generate the second input control signal PIN<2> that is enabled when the synthesis command SCMD is input for the second time. The input control signal generation circuit 341 may generate the third input control signal PIN<3> that is enabled when the synthesis command SCMD is input for the third time. The input control signal generation circuit 341 may generate the fourth input control signal PIN<4> that is enabled when the synthesis command SCMD is input for the fourth time. The input control signal generation circuit 341 may generate the first input control signal PIN<1> that is enabled when the synthesis command SCMD is input for the fifth time.

The output control signal generation circuit 342 may generate first to fourth output control signals POUT<1:4> that are sequentially enabled whenever the shifting signal SFT is input. The output control signal generation circuit 342 may generate the first output control signal POUT<1> that is enabled when the shifting signal SFT is input for the first time. The output control signal generation circuit 342 may generate the second output control signal POUT<2> that is enabled when the shifting signal SFT is input for the second time. The output control signal generation circuit 342 may generate the third output control signal POUT<3> that is enabled when the shifting signal SFT is input for the third time. The output control signal generation circuit 342 may generate the fourth output control signal POUT<4> that is enabled when the shifting signal SFT is input for the fourth time. The output control signal generation circuit 342 may generate the first output control signal POUT<1> that is enabled when the shifting signal SFT is input for the fifth time.

Figure 12:
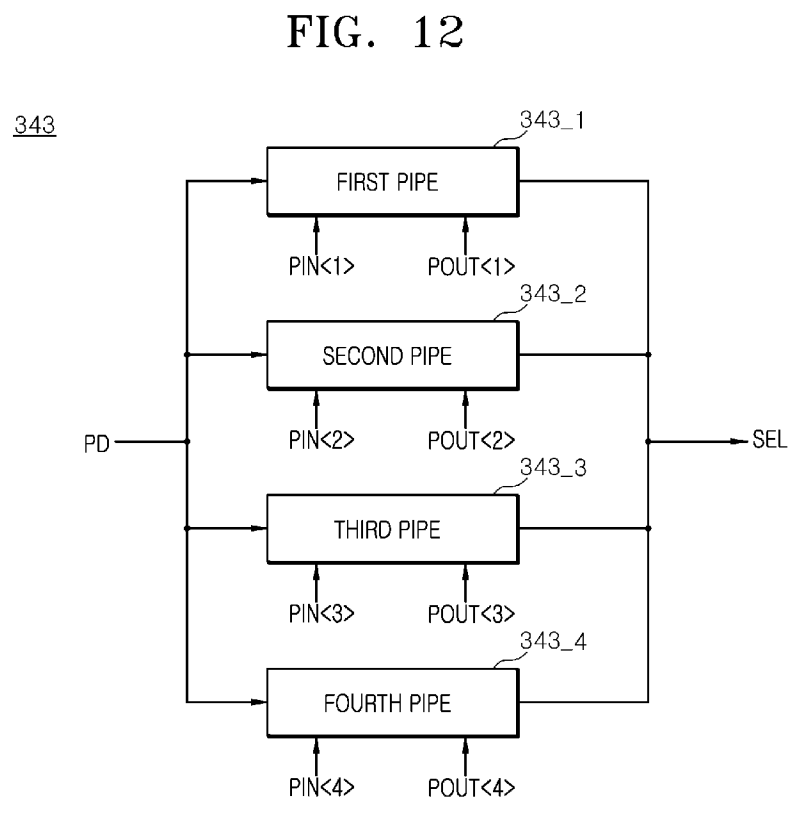

The pipe circuit 343 may include first to fourth pipe latches (343_1 to 343_4 in FIG. 12). The pipe circuit 343 may latch the phase detection signal PD in the first pipe latch (343_1 in FIG. 12) when the first input control signal PIN<1> is enabled. The pipe circuit 343 may output, as the selection signal SEL, the phase detection signal PD that has been latched in the first pipe latch (343_1 in FIG. 12) when the first output control signal POUT<1> is enabled. The pipe circuit 343 may latch the phase detection signal PD in the second pipe latch (343_2 in FIG. 12) when the second input control signal PIN<2> is enabled. The pipe circuit 343 may output, as the selection signal SEL, the phase detection signal PD that has been latched in the second pipe latch (343_2 in FIG. 12) when the second output control signal POUT<2> is enabled. The pipe circuit 343 may latch the phase detection signal PD in the third pipe latch (343_3 in FIG. 12) when the third input control signal PIN<3> is enabled. The pipe circuit 343 may output, as the selection signal SEL, the phase detection signal PD that has been latched in the third pipe latch (343_3 in FIG. 12) when the third output control signal POUT<3> is enabled. The pipe circuit 343 may latch the phase detection signal PD in the fourth pipe latch (343_4 in FIG. 12) when the fourth input control signal PIN<4> is enabled. The pipe circuit 343 may output, as the selection signal SEL, the phase detection signal PD that has been latched in the fourth pipe latch (343_4 in FIG. 12) when the fourth output control signal POUT<4> is enabled.

Figure 10:
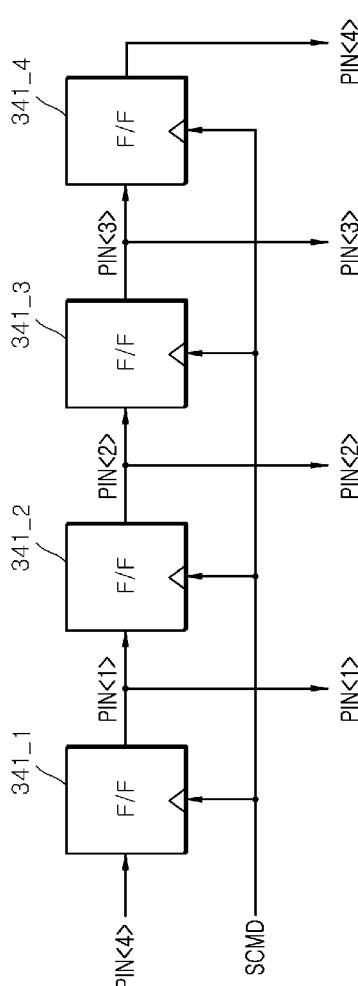
FIG. 10 is a block diagram illustrating a construction according to an embodiment of an input control signal generation circuit that is included in the selection signal generation circuit illustrated in FIG. 9.

FIG. 10 is a block diagram illustrating a construction according to an embodiment of the input control signal generation circuit 341 that is included in the selection signal generation circuit 340. The input control signal generation circuit 341 may include seventh to tenth flip-flops (F/Fs) 341_1, 341_2, 341_3, and 341_4.

The seventh flip-flop 341_1 may generate the first input control signal PIN<1> based on the fourth input control signal PIN<4> when the synthesis command SCMD having a logic high level is input. The seventh flip-flop 341_1 may output the fourth input control signal PIN<4> as the first input control signal PIN<1> when the synthesis command SCMD having a logic high level is input.

The eighth flip-flop 341_2 may generate the second input control signal PIN<2> based on the first input control signal PIN<1> when the synthesis command SCMD having a logic high level is input. The eighth flip-flop 341_2 may output the first input control signal PIN<1> as the second input control signal PIN<2> when the synthesis command SCMD having a logic high level is input.

The ninth flip-flop 341_3 may generate the third input control signal PIN<3> based on the second input control signal PIN<2> when the synthesis command SCMD having a logic high level is input. The ninth flip-flop 341_3 may output the second input control signal PIN<2> as the third input control signal PIN<3> when the synthesis command SCMD having a logic high level is input.

The tenth flip-flop 341_4 may generate the fourth input control signal PIN<4> based on the third input control signal PIN<3> when the synthesis command SCMD having a logic high level is input. The tenth flip-flop 341_4 may output the third input control signal PIN<3> as the fourth input control signal PIN<4> when the synthesis command SCMD having a logic high level is input.

Figure 11:
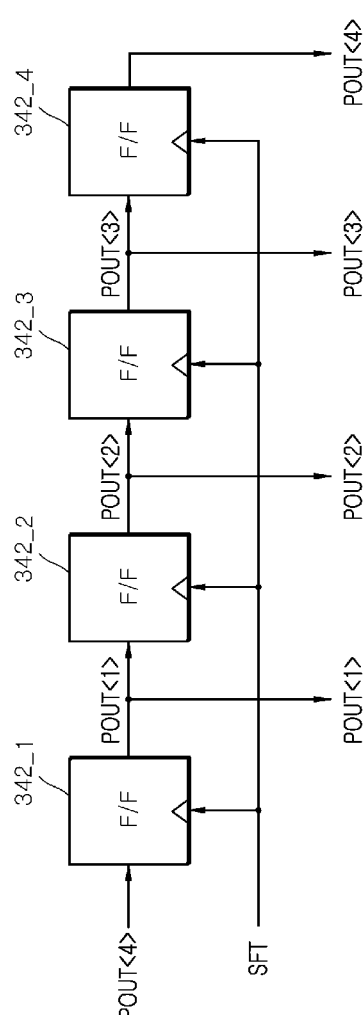
FIG. 11 is a block diagram illustrating a construction according to an embodiment of an output control signal generation circuit that is included in the selection signal generation circuit illustrated in FIG. 9.

FIG. 11 is a block diagram illustrating a construction according to an embodiment of the output control signal generation circuit 342 that is included in the selection signal generation circuit 340. The output control signal generation circuit 342 may include eleventh to fourteenth flip-flops (F/Fs) 342_1, 342_2, 342_3, and 342_4.

The eleventh flip-flop 342_1 may generate the first output control signal POUT<1> based on the fourth output control signal POUT<4> when the shifting signal SFT having a logic high level is input. The eleventh flip-flop 342_1 may output the fourth output control signal POUT<4> as the first output control signal POUT<1> when the shifting signal SFT having a logic high level is input.

The twelfth flip-flop 342_2 may generate the second output control signal POUT<2> based on the first output control signal POUT<1> when the shifting signal SFT having a logic high level is input. The twelfth flip-flop 342_2 may output the first output control signal POUT<1> as the second output control signal POUT<2> when the shifting signal SFT having a logic high level is input.

The thirteenth flip-flop 342_3 may generate the third output control signal POUT<3> based on the second output control signal POUT<2> when the shifting signal SFT having a logic high level is input. The thirteenth flip-flop 342_3 may output the second output control signal POUT<2> as the third output control signal POUT<3> when the shifting signal SFT having a logic high level is input.

The fourteenth flip-flop 342_4 may generate the fourth output control signal POUT<4> based on the third output control signal POUT<3> when the shifting signal SFT having a logic high level is input. The fourteenth flip-flop 342_4 may output the third output control signal POUT<3> as the fourth output control signal POUT<4> when the shifting signal SFT having a logic high level is input.

FIG. 12 is a block diagram illustrating a construction according to an embodiment of the pipe circuit 343 that is included in the selection signal generation circuit 340. The pipe circuit 343 may include the first pipe latch 343_1, the second pipe latch 343_2, the third pipe latch 343_3, and the fourth pipe latch 343_4.

The first pipe latch 343_1 may latch the phase detection signal PD when the first input control signal PIN<1> is enabled. The first pipe latch 343_1 may output, as the selection signal SEL, the phase detection signal PD that is latched when the first output control signal POUT<1> is enabled.

The second pipe latch 343_2 may latch the phase detection signal PD when the second input control signal PIN<2> is enabled. The second pipe latch 343_2 may output, as the selection signal SEL, the phase detection signal PD that is latched when the second output control signal POUT<2> is enabled.

The third pipe latch 343_3 may latch the phase detection signal PD when the third input control signal PIN<3> is enabled. The third pipe latch 343_3 may output, as the selection signal SEL, the phase detection signal PD that is latched when the third output control signal POUT<3> is enabled.

The fourth pipe latch 343_4 may latch the phase detection signal PD when the fourth input control signal PIN<4> is enabled. The fourth pipe latch 343_4 may output, as the selection signal SEL, the phase detection signal PD that is latched when the fourth output control signal POUT<4> is enabled.

Figure 13:
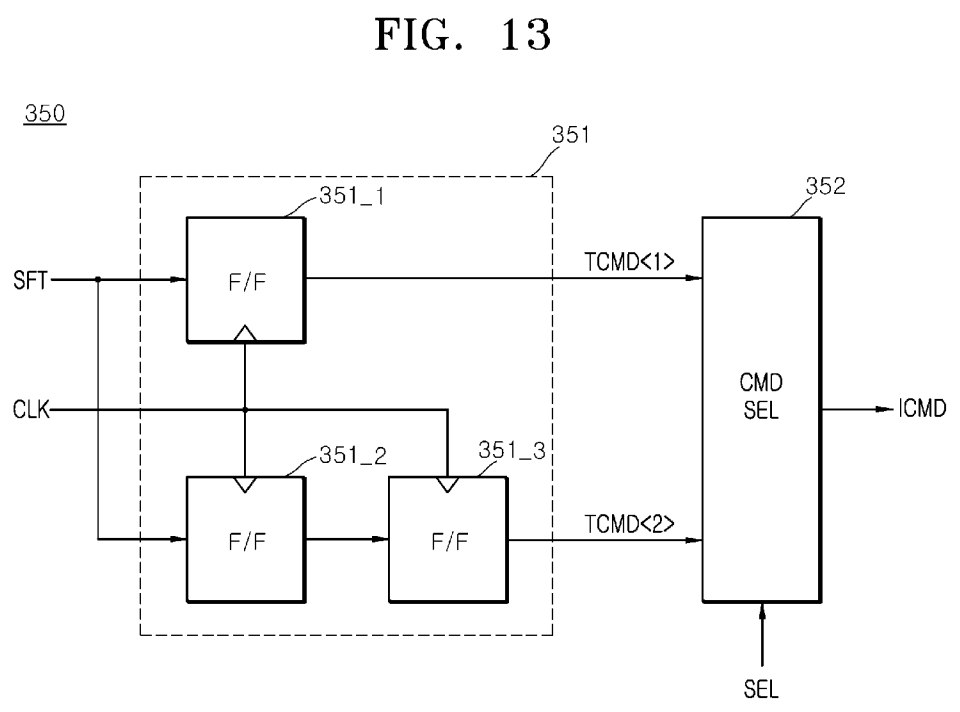

FIG. 13 is a block diagram illustrating a construction according to an embodiment of the command phase control circuit 350 that is included in the internal command generation circuit 220. The command phase control circuit 350 may include a transfer command generation circuit 351 and a command selection circuit (CMD SEL) 352.

The transfer command generation circuit 351 may include fifteenth to seventeenth flip-flops (F/Fs) 351_1, 351_2, and 351_3.

The fifteenth flip-flop 351_1 may latch the shifting signal SFT in synchronization with a rising edge of the clock CLK. The fifteenth flip-flop 351_1 may output, as a first transfer command TCMD<1>, shifting signal SFT that is latched for one cycle interval of the clock CLK.

The sixteenth flip-flop 351_2 may latch the shifting signal SFT in synchronization with a rising edge of the clock CLK. The sixteenth flip-flop 351_2 may output the shifting signal SFT that is latched for one cycle interval of the clock CLK.

The seventeenth flip-flop 351_3 may latch the output signal of the sixteenth flip-flop 351_2 in synchronization with a rising edge of the clock CLK. The seventeenth pipe latch 351_3 may output the output signal of the sixteenth flip-flop 351_2, which is latched for one cycle interval of the clock CLK, as a second transfer command TCMD<2>.

The command selection circuit 352 may output any one of the first transfer command TCMD<1> and the second transfer command TCMD<2> as the internal command ICMD in response to the selection signal SEL. The command selection circuit 352 may output the first transfer command TCMD<1> as the internal command ICMD when the selection signal SEL is disabled to a logic low level. The command selection circuit 352 may output the second transfer command TCMD<2> as the internal command ICMD when the selection signal SEL is enabled to a logic high level.

Figure 14:
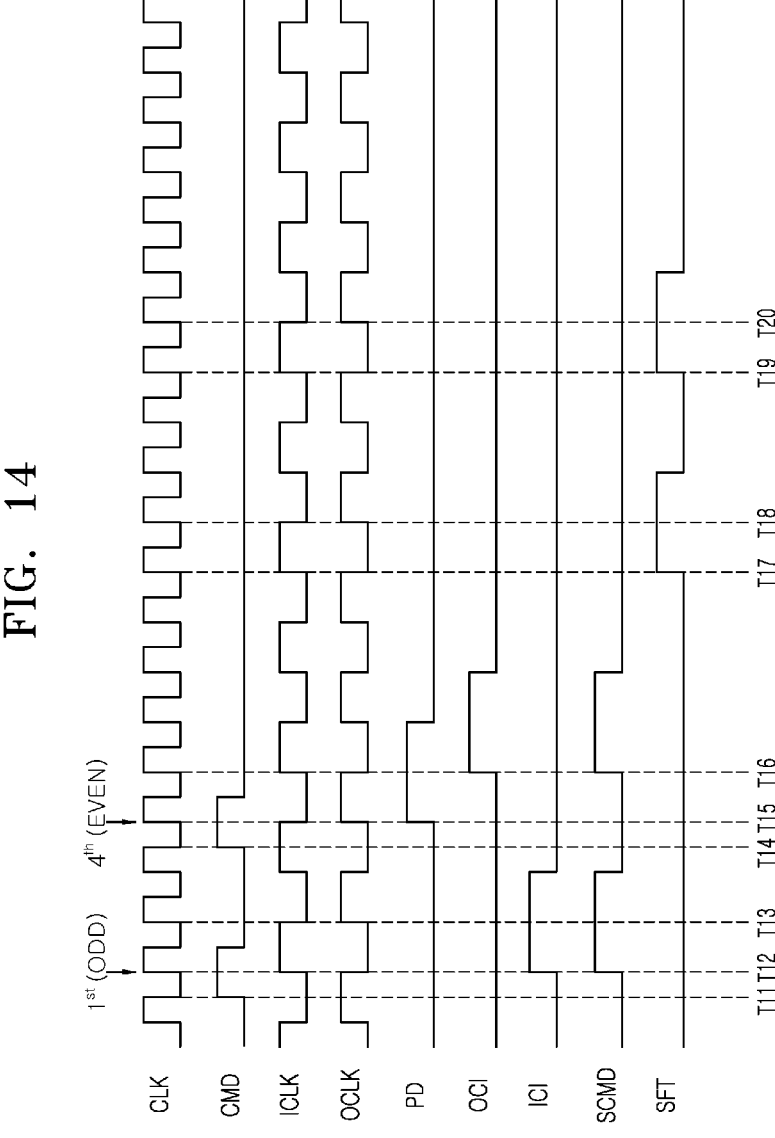
FIGS. 14 and 15 are timing diagrams for describing an operation of the semiconductor device according to an embodiment of the present disclosure.
Figure 15:
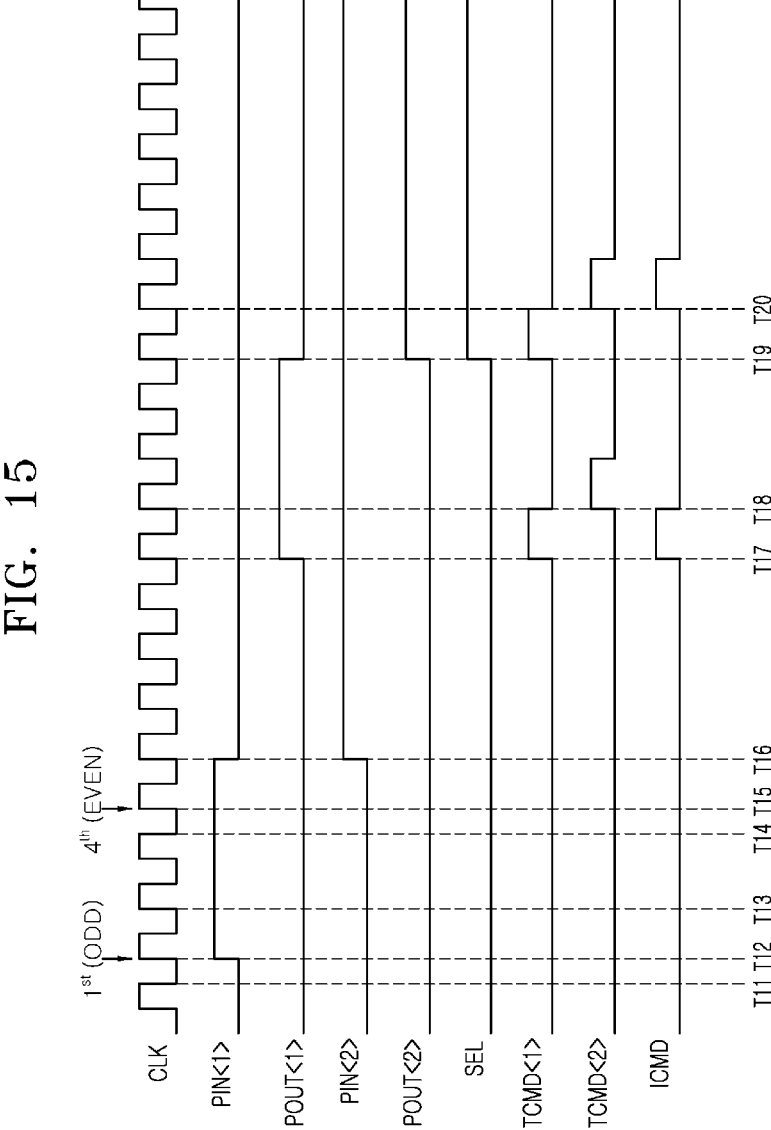

A write operation of the semiconductor system 1 according to an embodiment of the present disclosure is described with reference to FIGS. 14 and 15, but an operation of the command CMD being input to the fourth pulse ($4^{th}$ EVEN) of the clock CLK after being input to the first pulse ($1^{st}$ ODD) of the clock CLK is described as follows as an example.

At timing T11, the controller 10 may output the clock CLK that is periodically toggled and the command CMD for performing a write operation.

At timing T12, the frequency division circuit 210 may generate the first division clock ICLK including a pulse that has a ½ frequency of the clock CLK and that is generated in synchronization with an odd-numbered pulse of the clock CLK, by dividing the frequency of the clock CLK. The first division clock ICLK may be periodically toggled and generated at the ½ frequency of the clock CLK.

The third command input circuit 321 of the synthesis command generation circuit 320 may generate the second input command signal ICI that is enabled to a logic high level when the command CMD having a logic high level is input in synchronization with a rising edge of the first division clock ICLK.

The signal synthesis circuit 322 of the synthesis command generation circuit 320 may generate the synthesis command SCMD that is enabled to a logic high level when the second input command signal ICI is enabled to a logic high level.

The input control signal generation circuit 341 of the selection signal generation circuit 340 may generate the first input control signal PIN<1> that is enabled to a logic high level when the synthesis command SCMD is input for the first time.

At timing T13, the frequency division circuit 210 may generate the second division clock OCLK including a pulse that has a ½ frequency of the clock CLK and that is generated in synchronization with an even-numbered pulse of the clock CLK, by dividing the frequency of the clock CLK. The second division clock OCLK may be periodically toggled and generated at the ½ frequency of the clock CLK.

The phase detection circuit 310 may generate the phase detection signal PD having a logic low level by latching the command CMD in synchronization with the second division clock OCLK.

The first pipe latch 343_1 of the pipe circuit 343 may latch the phase detection signal PD having a logic low level when the first input control signal PIN<1> is enabled to a logic high level.

At timing T14, the controller 10 may output the clock CLK that is periodically toggled and the command CMD for performing the write operation.

At timing T15, the frequency division circuit 210 may generate the second division clock OCLK including a pulse that has a ½ frequency of the clock CLK and that is generated in synchronization with an even-numbered pulse of the clock CLK, by dividing the frequency of the clock CLK.

The phase detection circuit 310 may generate the phase detection signal PD having a logic high level by latching the command CMD in synchronization with the second division clock OCLK.

At timing T16, the phase detection circuit 310 may generate first input command signal OCI by latching the phase detection signal PD in synchronization with a rising edge of the first division clock ICLK.

The signal synthesis circuit 322 of the synthesis command generation circuit 320 may generate the synthesis command SCMD that is enabled to a logic high level when the first input command signal OCI is enabled to a logic high level.

The input control signal generation circuit 341 of the selection signal generation circuit 340 may generate the second input control signal PIN<2> that is enabled to a logic high level when the synthesis command SCMD is input for the second time.

The second pipe latch 343_2 of the pipe circuit 343 may latch the phase detection signal PD having a logic high level when the second input control signal PIN<2> is enabled to a logic high level.

At timing T17, the shifting circuit 330 may generate the shifting signal SFT having a logic high level by shifting the synthesis command SCMD that has been generated to have a logic high level at timing T12 by a write latency interval, based on the first to fourth latency signals LTC<1:4>.

The output control signal generation circuit 342 of the selection signal generation circuit 340 may generate the first output control signal POUT<1> that is enabled to a logic high level when the shifting signal SFT is input for the first time.

The first pipe latch 343_1 of the pipe circuit 343 may output, as the selection signal SEL, the phase detection signal PD that has been latched at a logic low level at timing T13, when the first output control signal POUT<1> is enabled to a logic high level.

The transfer command generation circuit 351 of the command phase control circuit 350 may latch the shifting signal SFT having a logic high level in synchronization with a rising edge of the clock CLK, and may output, as the first transfer command TCMD<1>, the shifting signal SFT that has been latched for one cycle interval of the clock CLK.

The command selection circuit 352 of the command phase control circuit 350 may output the first transfer command TCMD<1> having a logic high level as the internal command ICMD when the selection signal SEL is disabled to a logic low level.

The memory circuit 240 may store the first to N-th data DATA<1:N> in a memory cell MC that is selected by the first to M-th internal addresses IADD<1: M> when the internal command ICMD is generated after the start of the write operation.

At timing T18, the transfer command generation circuit 351 of the command phase control circuit 350 may output the shifting signal SFT as the second transfer command TCMD<2> by shifting the shifting signal SFT that has been latched for one cycle of the clock CLK.

At timing T19, the shifting circuit 330 may generate the shifting signal SFT having a logic high level by shifting the synthesis command SCMD that has been generated to have a logic high level at timing T16 by a write latency interval, based on the first to fourth latency signals LTC<1:4>.

The output control signal generation circuit 342 of the selection signal generation circuit 340 may generate the second output control signal POUT<2> that is enabled to a logic high level when the shifting signal SFT is input for the second time.

The second pipe latch 343_2 of the pipe circuit 343 may output, as the selection signal SEL, the phase detection signal PD that has been latched at a logic high level at timing T16, when the second output control signal POUT<2> is enabled to a logic high level.

The transfer command generation circuit 351 of the command phase control circuit 350 may latch the shifting signal SFT having a logic high level in synchronization with a rising edge of the clock CLK, and may output, as the first transfer command TCMD<1>, the shifting signal SFT that has been latched for one cycle interval of the clock CLK.

At timing T20, the transfer command generation circuit 351 of the command phase control circuit 350 may output the shifting signal SFT as the second transfer command TCMD<2> by shifting the shifting signal SFT that has been latched for one cycle of the clock CLK.

The command selection circuit 352 of the command phase control circuit 350 may output the second transfer command TCMD<2> having a logic high level as the internal command ICMD when the selection signal SEL is enabled to a logic high level.

The memory circuit 240 may store the first to N-th data DATA<1:N> in a memory cell MC that is selected by the first to M-th internal addresses IADD<1: M> when the internal command ICMD is generated after the start of the write operation.

The semiconductor system 1 according to an embodiment of the present disclosure can latch, in the pipe latch, the phase detection signal PD that is generated by detecting input timing of the command CMD that is input in synchronization with the clock CLK, and can compensate for generation timing of the internal command ICMD that is generated from the command CMD based on the phase detection signal PD that has been latched in the pipe latch. In an embodiment, he semiconductor system 1 can reduce the area and current consumption of the shifting circuit for shifting the internal command ICMD, by latching, in the pipe latch, the phase detection signal PD that is generated by detecting input timing of the command CMD and compensating for generation timing of the internal command ICMD by using one shifting circuit based on the phase detection signal PD.

Figure 16:
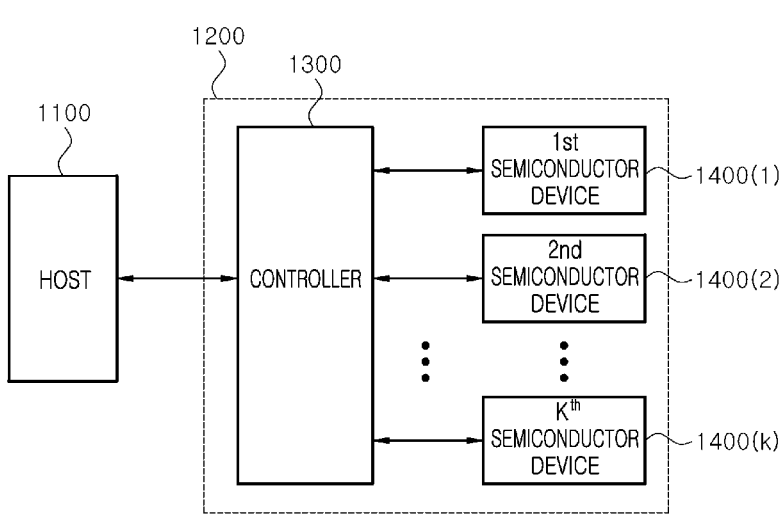
FIG. 16 is a diagram illustrating a construction according to an embodiment of an electronic system to which the semiconductor system illustrated in FIGS. 1 and 15 has been applied.

FIG. 16 is a diagram illustrating a construction according to an embodiment of an electronic system 1000 according to an embodiment of the present disclosure. As illustrated in FIG. 16, the electronic system 1000 may include a host 1100 and a semiconductor system 1200.

The host 1100 and the semiconductor system 1200 may mutually transmit signals by using an interface protocol. The interface protocol that is used between the host 1100 and the semiconductor system 1200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), a universal serial bus (USB).

The semiconductor system 1200 may include a controller 1300 and semiconductor devices 1400(K:1). The controller 1300 may control the semiconductor devices 1400 (K:1) so that the semiconductor devices 1400(K:1) each perform a write operation and a read operation. Each of the semiconductor devices 1400(K:1) may latch, in the pipe latch, the phase detection signal PD that is generated by detecting input timing of the command CMD that is input in synchronization with the clock CLK, and may compensate for generation timing of the internal command ICMD that is generated from the command CMD based on the phase detection signal PD that has been latched in the pipe latch. Each of the semiconductor devices 1400(K:1), in an embodiment, can reduce the area and current consumption of the shifting circuit for shifting the internal command ICMD, by latching, in the pipe latch, the phase detection signal PD that is generated by detecting input timing of the command CMD and compensating for generation timing of the internal command ICMD by using one shifting circuit based on the phase detection signal PD.

The controller 1300 may be implemented as the controller 10 illustrated in FIG. 1. The semiconductor devices 1400 (K:1) may each be implemented as the semiconductor device 20 illustrated in FIG. 1. According to an embodiment, the semiconductor devices 20 may each be implemented as one of dynamic random access memory (DRAM), phase change random access memory (PRAM), resistive random access memory (RRAM), magnetic random access memory (MRAM), and ferroelectric random access memory (FRAM).

What is claimed is:

1. A semiconductor device comprising:
a frequency division circuit configured to receive a clock to generate a first division clock and a second division clock by dividing a frequency of the clock; and
an internal command generation circuit configured to receive a command in synchronization with the first division clock and the second division clock to generate an internal command based on the command received in synchronization with the first division clock and the second division clock, configured to latch, in a pipe latch, a phase detection signal that is generated based on timing at which the command is received, and configured to compensate for generation timing of the internal command based on the phase detection signal that has been latched in the pipe latch.

2. The semiconductor device of claim 1,
wherein the frequency division circuit generates the first division clock comprising a pulse that has a ½ frequency of the clock and that is generated in synchronization with an odd-numbered pulse of the clock, and
wherein the frequency division circuit generates the second division clock comprising a pulse that has a ½ frequency of the clock and that is generated in synchronization with an even-numbered pulse of the clock.

3. The semiconductor device of claim 1, wherein the frequency division circuit generates the first division clock and the second division clock having opposite phases by dividing the frequency of the clock.

4. The semiconductor device of claim 1, wherein the internal command generation circuit comprises:
a phase detection circuit configured to generate the phase detection signal and a first input command signal by latching the command in synchronization with the first division clock and the second division clock:
a synthesis command generation circuit configured to generate a synthesis command by synchronizing the command and the first input command signal in synchronization with the first division clock;
a shifting circuit configured to generate a shifting signal by shifting the synthesis command by a set interval;
a selection signal generation circuit configured to latch the phase detection signal in the pipe latch in synchronization with the synthesis command and configured to generate a selection signal based on the phase detection signal that has been stored in the pipe latch, in synchronization with the shifting signal; and
a command phase control circuit configured to generate the internal command by shifting the shifting signal in response to the selection signal in synchronization with the clock.

5. The semiconductor device of claim 4, wherein the phase detection circuit comprises:
a first command input circuit configured to generate the phase detection signal by latching the command in synchronization with the second division clock; and
a second command input circuit configured to generate the first input command signal by latching the phase detection signal in synchronization with the first division clock.

6. The semiconductor device of claim 4, wherein the synthesis command generation circuit comprises:
a third command input circuit configured to generate a second input command signal by latching the command in synchronization with the first division clock; and
a signal synthesis circuit configured to generate the synthesis command by synthesizing the first input command signal and the second input command signal.

7. The semiconductor device of claim 4, wherein the shifting circuit comprises:
a transfer signal generation circuit configured to generate a first transfer signal and a second transfer signal that are sequentially generated, by shifting the synthesis command in synchronization with the first division clock; and
a selection transfer circuit configured to output any one of the first transfer signal and the second transfer signal as the shifting signal based on a first latency signal and a second latency signal comprising information with regard to the set interval.

8. The semiconductor device of claim 4, wherein the selection signal generation circuit comprises:
an input control signal generation circuit configured to generate an input control signal that is enabled when the synthesis command is input;
an output control signal generation circuit configured to generate an output control signal that is enabled when the shifting signal is input; and
a pipe circuit configured to latch the phase detection signal when the input control signal is generated and configured to generate the selection signal based on the phase detection signal that has been latched, when the output control signal is generated.

9. The semiconductor device of claim 4, wherein the command phase control circuit comprises:

a transfer command generation circuit configured to generate a first transfer command and a second transfer command that are sequentially generated, by shifting the shifting signal in synchronization with the clock; and a command selection circuit configured to output any one of the first transfer command and the second transfer command as the internal command in response to the selection signal.

10. A semiconductor system comprising:

a controller configured to output a clock that is periodically toggled and configured to output a command, an address, and data; and a semiconductor device configured to sequentially latch, in multiple pipe latches, a phase detection signal that is generated by detecting input timing of the command that is input in synchronization with the clock, configured to compensate for generation timing of an internal command that is generated from the command based on the phase detection signal that has been latched in the multiple pipe latches, and configured to store the data based on the internal command and the address.

11. The semiconductor system of claim 10, wherein the semiconductor device comprises:

a frequency division circuit configured to generate a first division clock and a second division clock by dividing a frequency of the clock;

an internal command generation circuit configured to generate the internal command based on the command in synchronization with the first division clock and the second division clock, configured to sequentially latch, in the multiple pipe latches, the phase detection signal that is generated based on the input timing of the command in synchronization with a pulse of the clock, and configured to compensate for the generation timing of the internal command based on the phase detection signal that has been latched in the multiple pipe latches;

an internal address generation circuit configured to generate an internal address by decoding the address in synchronization with the clock; and a memory circuit configured to store the data based on the internal address when the internal command is generated.

12. The semiconductor system of claim 11, wherein the frequency division circuit generates the first division clock comprising a pulse that has a ½ frequency of the clock and that is generated in synchronization with an odd-numbered pulse of the clock, and wherein the frequency division circuit generates the second division clock comprising a pulse that has a ½ frequency of the clock and that is generated in synchronization with an even-numbered pulse of the clock.

13. The semiconductor system of claim 11, wherein the frequency division circuit generates the first division clock and the second division clock having opposite phases by dividing the frequency of the clock.

14. The semiconductor system of claim 11, wherein:

the internal command generation circuit latches, in a first pipe latch, the phase detection signal that is generated when the command is input in synchronization with a first pulse of the clock, and the internal command generation circuit latches, in a second pipe latch, the phase detection signal that is generated when the command is input in synchronization with a second pulse of the clock.

15. The semiconductor system of claim 14, wherein the second pulse of the clock is a pulse that is generated after the first pulse of the clock is generated.

16. The semiconductor system of claim 14, wherein the phase detection signal is a signal that is disabled when the command is input in synchronization with the first division clock and that is enabled when the command is input in synchronization with the second division clock.

17. The semiconductor system of claim 11, wherein the internal command generation circuit comprises:

a phase detection circuit configured to generate the phase detection signal and a first input command signal by latching the command in synchronization with the first division clock and the second division clock;

a synthesis command generation circuit configured to generate a synthesis command by synchronizing the command and the first input command signal in synchronization with the first division clock;

a shifting circuit configured to generate a shifting signal by shifting the synthesis command by a set interval;

a selection signal generation circuit configured to sequentially latch the phase detection signal in the multiple pipe latches in synchronization with the synthesis command and configured to generate a selection signal based on the phase detection signal that has been latched in the multiple pipe latches, in synchronization with the shifting signal; and a command phase control circuit configured to generate the internal command by shifting the shifting signal in response to the selection signal in synchronization with the clock.

18. The semiconductor system of claim 17, wherein the phase detection circuit comprises:

a first command input circuit configured to generate the phase detection signal by latching the command in synchronization with the second division clock; and a second command input circuit configured to generate the first input command signal by latching the phase detection signal in synchronization with the first division clock.

19. The semiconductor system of claim 17, wherein the synthesis command generation circuit comprises:

a third command input circuit configured to generate a second input command signal by latching the command in synchronization with the first division clock; and a signal synthesis circuit configured to generate the synthesis command by synthesizing the first input command signal and the second input command signal.

20. The semiconductor system of claim 17, wherein the shifting circuit comprises:

a transfer signal generation circuit configured to generate a first transfer signal and a second transfer signal that are sequentially generated, by shifting the synthesis command in synchronization with the first division clock; and a selection transfer circuit configured to output any one of the first transfer signal and the second transfer signal as the shifting signal based on a first latency signal and a second latency signal comprising information with regard to the set interval.

21. The semiconductor system of claim 17, wherein the selection signal generation circuit comprises:

an input control signal generation circuit configured to generate a first input control signal and a second input control signal that are sequentially enabled whenever the synthesis command is input;

an output control signal generation circuit configured to generate a first output control signal and a second output control signal that are sequentially enabled whenever the shifting signal is input; and a pipe circuit configured to latch the phase detection signal when the first input control signal and the second input control signal are generated and configured to output, as the selection signal, the phase detection signal that has been latched when the first output control signal and the second output control signal are generated.

22. The semiconductor system of claim 21, wherein the pipe circuit comprises:

a first pipe latch configured to latch the phase detection signal when the first input control signal is generated and configured to output, as the selection signal, the phase detection signal that has been latched when the first output control signal is generated; and a second pipe latch configured to latch the phase detection signal when the second input control signal is generated and configured to output, as the selection signal, the phase detection signal that has been latched when the second output control signal is generated.

23. The semiconductor system of claim 17, wherein the command phase control circuit comprises:

a transfer command generation circuit configured to generate a first transfer command and a second transfer command that are sequentially generated, by shifting the shifting signal in synchronization with the clock; and a command selection circuit configured to output any one of the first transfer command and the second transfer command as the internal command in response to the selection signal.

* * * * *